United States Patent [19]
Dildine

[11] Patent Number: 5,416,422
[45] Date of Patent: May 16, 1995

[54] APPARATUS AND METHOD FOR DETERMINING SINGLE SIDEBAND NOISE FIGURE FROM DOUBLE SIDEBAND MEASUREMENTS

[75] Inventor: Robert G. Dildine, Santa Rosa, Calif.

[73] Assignee: Hewlett-Packard Company, Palo Alto, Calif.

[21] Appl. No.: 246,524

[22] Filed: May 20, 1994

[51] Int. Cl.$^6$ ............................................. G01R 27/00
[52] U.S. Cl. ................................... 324/614; 324/613; 455/67.3
[58] Field of Search ................ 324/613, 614; 455/67.3, 455/226.1, 226.4, 296, 302

[56] References Cited

U.S. PATENT DOCUMENTS

| | | | |
|---|---|---|---|
| 4,998,071 | 3/1991 | Strid et al. | 324/613 |
| 5,053,714 | 10/1991 | Durand | 324/614 X |
| 5,179,344 | 1/1993 | Najle et al. | 324/613 |
| 5,191,294 | 3/1993 | Grace et al. | 324/613 |

*Primary Examiner*—Kenneth A. Wieder
*Assistant Examiner*—Diep Do
*Attorney, Agent, or Firm*—William C. Milks, III

[57] ABSTRACT

A single sideband noise figure of a device under test is determined from double sideband measurements. A noise measurement system is provided, which includes a noise source, a mixer, a local oscillator, and a tunable intermediate frequency receiver. Three independent measurements are performed (one with the local oscillator frequency on the high side of the RF measurement frequency, another with the local oscillator frequency on the low side of the RF measurement frequency, and the third with the local oscillator frequency at the RF measurement frequency and the intermediate frequency at twice its former frequency). These noise power measurements are combined in such a way as to cancel the unwanted sidebands. Preferably, three output noise power measurements are also performed during a calibration so that the subsequent measurements are corrected for impedance mismatch errors. The complexity and cost of performing accurate single sideband noise figure measurements are reduced compared to conventional single sideband measurement systems.

14 Claims, 10 Drawing Sheets

APPARATUS AND METHOD FOR DETERMINING SINGLE SIDEBAND NOISE FIGURE FROM DOUBLE SIDEBAND MEASUREMENTS

BACKGROUND OF THE INVENTION

This invention relates to electronic instruments and techniques for measuring electrical signals and, more particularly, to electronic instruments and techniques for measuring the noise figure of a device under test. Specifically, one embodiment of the invention provides an apparatus and method for determining the single sideband noise figure of a device under test from double sideband measurements.

Measurement of noise figure at radio (e.g., microwave) frequencies typically requires the use of a local oscillator (LO) and mixer to down-convert the measurement frequency to a suitable intermediate frequency (IF) for detection by a receiver. During conventional noise figure measurements on a device under test, a radio frequency (RF) input signal from the device under test is down-converted by the mixer. The mixer combines the RF input signal with a signal produced by the LO, or a harmonic of the signal from the LO, to produce a predetermined IF output signal at a frequency suitable for further processing by the receiver. This causes the down-conversion of an image signal as well as the wanted signal. The resultant noise power at the intermediate frequency is typically assumed to be an average of the power in the two sidebands. However, this image signal can be a source of considerable measurement error when the device under test does not have a flat frequency response. See, "Noise Figure Measurement Accuracy," *Hewlett-Packard Application Note 57-2.*

Figure 1:
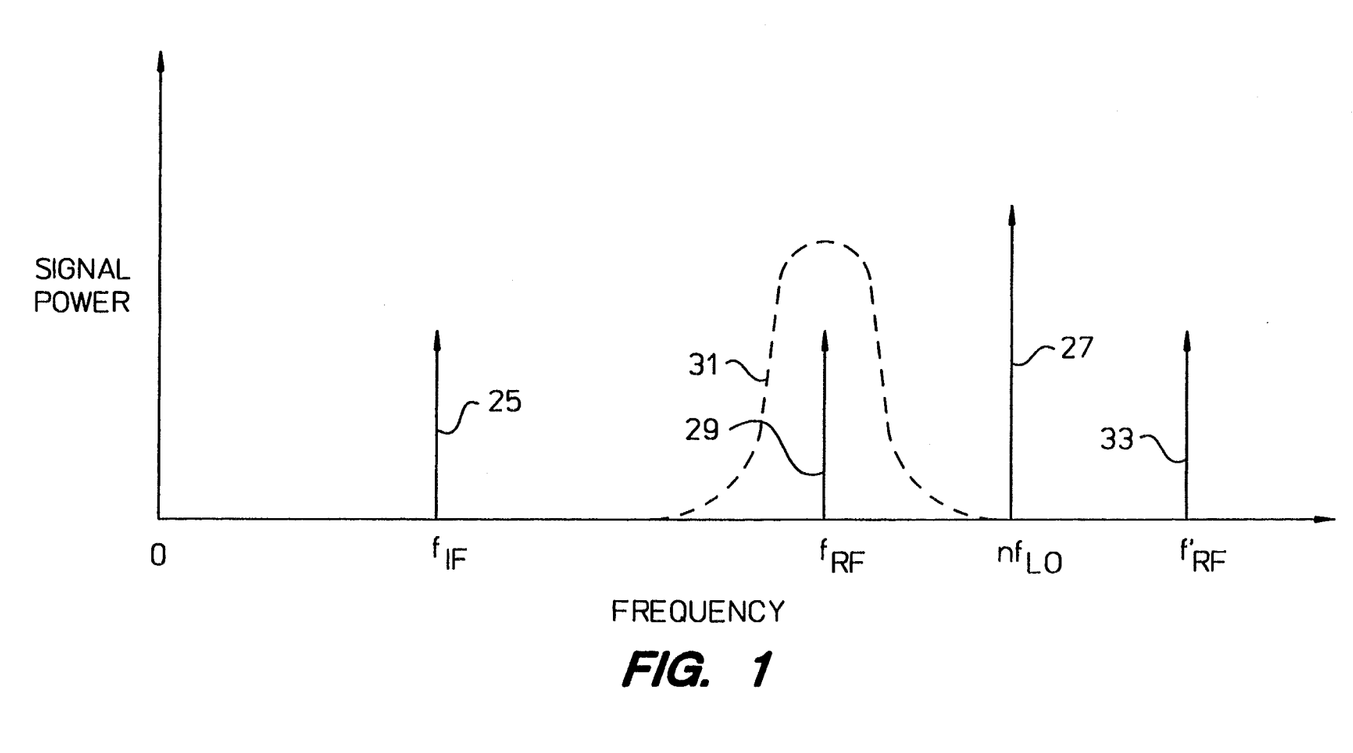
FIG. 1 is a graph which illustrates the relationship of RF, LO, and IF signals in a downconverter.

The graph in FIG. 1 illustrates the result of the down conversion by the mixer, evidencing the relationship between the LO, RF, and predetermined IF frequencies. In FIG. 1, the vertical axis represents signal power, and the horizontal axis represents signal frequency. The predetermined IF signal 25 has a frequency equal to the difference between the LO signal (or harmonic) 27 and the RF input signal 29, so that-the RF input signal is measured by monitoring a set IF frequency, below the LO signal frequency, at $f_{RF}=(n)f_{LO}-f_{IF}$. However, an image RF signal above the LO signal frequency, at $f'_{RF}=(n)f_{LO}+f_{IF}$, will also produce a signal at the monitored IF frequency. To resolve this ambiguity, an analog bandpass filter is typically provided over a frequency range including $f_{RF}$, as shown by the broken line curve 31 that appears in FIG. 1, thereby attenuating any image signal 33 at $f'_{RF}$. The bandpass filter is essential to eliminate unwanted mixing products from being measured.

The conventional technique to remove image noise is to filter the signal from the device under test before the signal is down-converted. The passband of the bandpass filter must track the sweeping LO signal, with the center frequency of the passband separated from the LO frequency (or harmonic) by the IF signal frequency when noise figure measurements are performed over a range of frequencies to eliminate the unwanted sideband. This requires a suitable filter and for broadband measurements requires that either a tunable bandpass filter, such as a magnetically tunable yttrium-iron-garnet (YIG) or barium-ferrite filter, or fixed tuned filters with multiple conversions be used. However, this can be time-consuming and costly, because either a number of filters with different passbands or a very expensive tunable filter is required.

Furthermore, an analysis of frequency-conversion techniques has previously been applied to microwave transistor noise measurements. See, G. Caruso and M. Sannino, "Analysis of Frequency-Conversion Techniques in Measurements of Microwave Transistor Noise Temperatures," *IEEE Trans. on Microwave Theory and Techniques*, vol. MTT-25, no. 11, pp. 870–873, November 1977, and G. Caruso and M. Sannino, "Determination of Microwave Two-Port Noise Parameters Through Computer-Aided Frequency-Conversion Techniques," *IEEE Trans. on Microwave Theory and Techniques*, vol. MTT-27, no. 9, pp. 779–783, September 1979. However, the reported techniques only correct for changes in noise figure due to changes in the noise source impedance between the two sidebands. Also, some of the applied assumptions are not applicable to all possible test devices.

It is desirable that an alternate technique to analog filtering for removing the noise power at the image frequency be provided when single sideband noise figure measurements are performed on a device under test. Furthermore, it is desirable that these single sideband noise figure measurements be corrected for change in output impedance of the noise source and noise source impedance mismatch with the receiver.

SUMMARY OF THE INVENTION

In accordance with one embodiment of the invention, an apparatus and method are provided for determining the single sideband noise figure for a device under test using a downconverter which performs double sideband measurements. A noise measurement system is provided, which comprises a noise source, a mixer, a local oscillator, and a receiver, such as a noise figure meter, as a tunable intermediate frequency receiver. Three independent measurements are performed on a device under test (one with the local oscillator frequency on the high side of the RF measurement frequency, another with the local oscillator frequency on the low side of the RF measurement frequency, and the third with the local oscillator frequency at the RF measurement frequency and the intermediate frequency at twice its former frequency). This results in three independent equations in three unknowns, from which the image noise power can be determined and cancelled to provide a single sideband noise figure measurement for the device under test.

In accordance with the invention, an apparatus and method are provided for determining the single sideband (SSB) noise figure of an active or passive device under test from three separate double sideband (DSB) noise power measurements without the need for expensive filtering equipment. Full noise source impedance mismatch correction is also preferably provided to achieve accurate single sideband noise figure measurements. Results obtained at various frequencies for both active and passive test devices with frequency dependent noise figures demonstrate the accuracy of the single sideband noise figure measurements.

BRIEF DESCRIPTION OF THE DRAWINGS

The above and other objects and features and the concomitant advantages of the present invention will be better understood and appreciated by those skilled in the art in view of the description of the preferred embodiments given below in conjunction with the accompanying drawings. In the drawings:

FIG. 2, comprising

DETAILED DESCRIPTION OF THE PREFERRED EMBODIMENTS

Figure 2A:
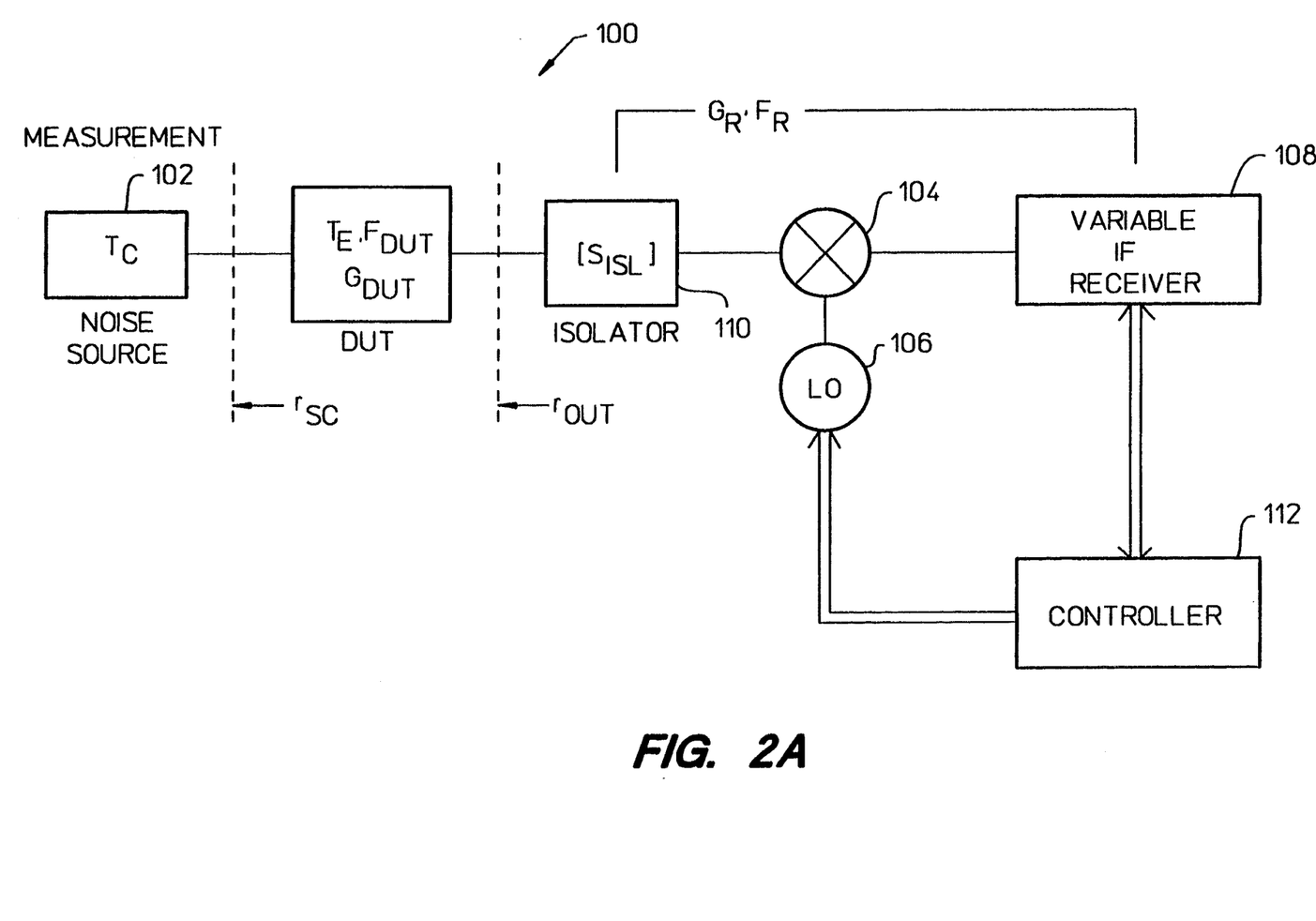
FIGS. 2A and 2B, is a block diagram of one embodiment of a noise measurement system constructed in accordance with the invention shown in a measurement configuration (FIG. 2A) and a calibration configuration (FIG. 2B)

A block diagram of one embodiment of the noise measurement system in accordance with the invention, generally indicated by the numeral 100, is shown in FIG. 2A. In accordance with a preferred embodiment of the invention, the noise measurement system 100 comprises a noise source 102, a microwave mixer 104, a local oscillator 106, and a tunable intermediate frequency (IF) receiver 108. The receiver 108 can be an HP 8970A noise figure meter available from Hewlett-Packard Company, Palo Alto, Calif. as a tunable IF receiver. Uncorrected noise power measurements are performed with the receiver 108. An isolator 110 is preferably included at the input of the receiver 108, as this facilitates a simple correction to account for change in receiver noise figure and gain with noise source impedance mismatch, as will be described in more detail later. See, M. W. Pospieszalski, "On the Measurement of Isolator and Receiver with Isolator at the Input," *IEEE Trans. Microwave Theory Tech.*, vol. MTT-34, no. 4, pp. 451–453, April 1986, U. Meier, "Measurements of Non-Matched Twoports with Automatic Noise Figure Meters," *Arch. Elektron. Ubertragungstechn.*, vol. 43, no. 2, pp. 125–128, 1989, and U. Meier, J. H. Hinken, and M. Ikonomou, "Rauschparameter von GaAs-MESFETs in Flossenleitungstechnik," *Kleinheubacher Berichte*, vol. 32, pp. 137–145, 1989. The noise measurement system 100 also comprises a controller 112, for example, a desktop personal computer, preferably connected to the noise source 102 (FIG. 2B) and to the local oscillator 106 by an HPIB (IEEE 488) instrument control bus and to the receiver 108 by a bus (FIGS. 2A and 2B) to perform measurements of output noise power and determine the single sideband noise figure of a device under test, as follows.

The noise figure of a device under test (DUT) shown in FIG. 2A connected between the noise source 102 and the mixer 104 at a particular frequency is defined as the ratio of:

(a) the total noise power per unit bandwidth available at an output port of the DUT when the noise temperature of an input termination is 290K; to (b) that portion of (a) at the input frequency due to the input termination.

See, "IRE Standards on Methods of Measuring Noise in Linear Two-Ports, 1959," *Proc. IRE*, vol. 48, pp. 60–68, January 1960. This definition leads to the equation:

$$\text{Noise Figure} = F = \frac{N_o}{GN_i} \quad (1)$$

where $N_o$ and $N_i$ are in watts and represent noise power output and input, respectively, and G represents the gain of the DUT.

Figure 3:
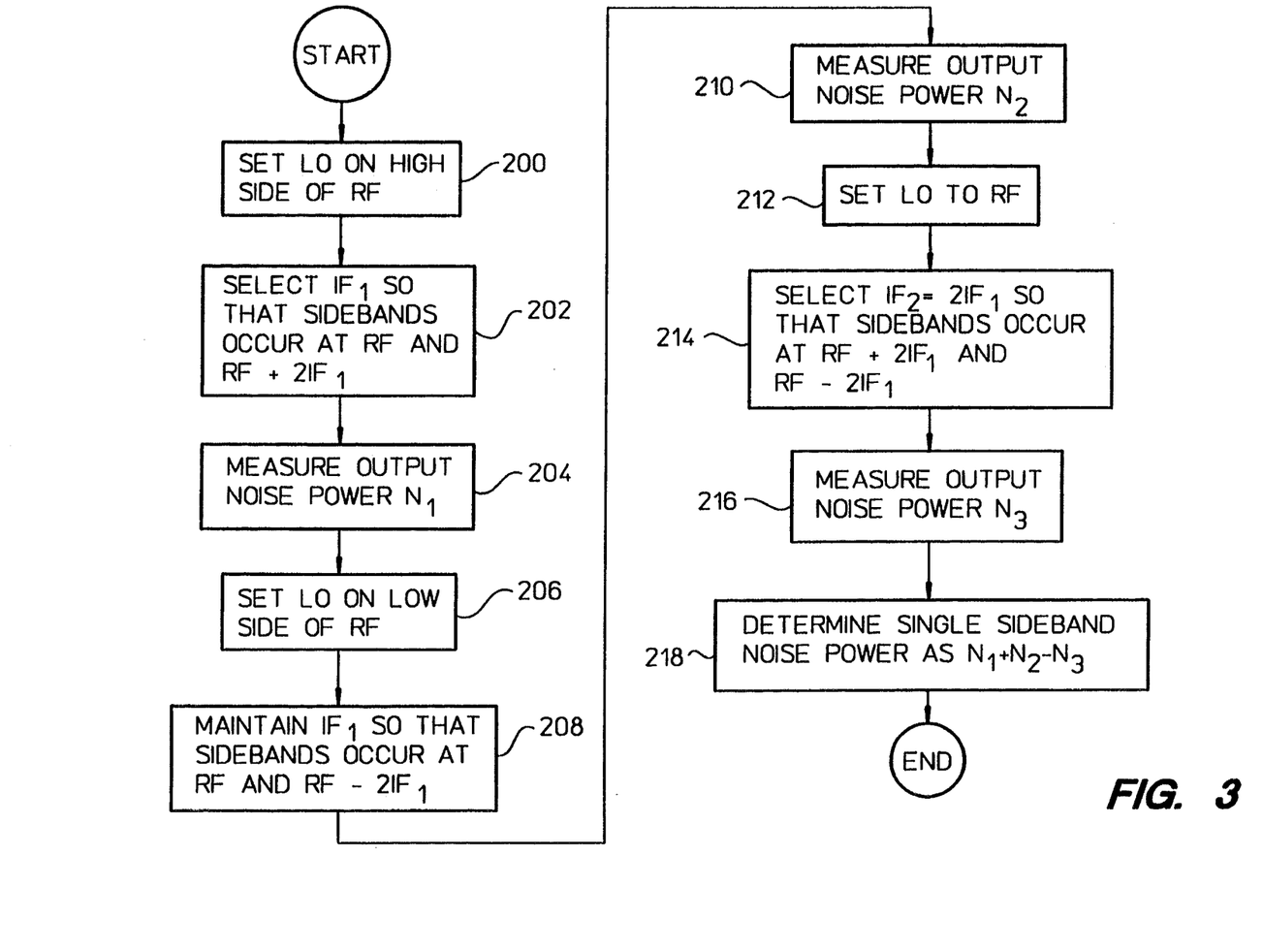
FIG. 3 is a flow chart in accordance with one embodiment of the method of the invention for determining a single sideband noise figure from three double sideband measurements on a device under test.

The method in accordance with one embodiment of the invention employs three output noise power measurements to obtain the single sideband output noise power at a desired RF measurement frequency. The first measurement is performed with the local oscillator 106 set by the controller 112 on the high side of the desired RF, as indicated by the numeral 200 shown in FIG. 3. The intermediate frequency ($IF_1$) is selected by the controller 112 such that the two measured sidebands occur at the desired RF and at $RF+2IF_1$, as indicated by the numeral 202 shown in FIG. 3. Using equation (1), this gives a first output noise power measurement of:

$$N_1 = (FGN_i)_{RF} + (FGN_i)_{RF+2IF_1} \quad (2)$$

as indicated by the numeral 204 shown in FIG. 3.

For the second measurement, the local oscillator 106 is set on the low side of the desired RF, as indicated by the numeral 206 shown in FIG. 3. The intermediate frequency remains the same such that the measured sidebands occur at the desired RF and at $RF-2IF_1$, as indicated by the numeral 208 shown in FIG. 3. Again using equation (1), this gives a second output noise power measurement of:

$$N_2 = (FGN_i)_{RF} + (FGN_i)_{RF-2IF_1} \quad (3)$$

as indicated by the numeral 210 shown in FIG. 3.

The third measurement is performed with the local oscillator 106 set to the desired RF, as indicated by the numeral 212 shown in FIG. 3. The intermediate frequency is selected as twice its former frequency ($IF_2 = 2 \times IF_1$) such that the two sidebands occur at $RF+2IF_1$ and $RF-2IF_1$, as indicated by the numeral 214 shown in FIG. 3. Using equation (1) again, this gives a third output noise power measurement of:

$$N_3 = (FGN_i)_{RF+2IF_1} + (FGN_i)_{RF-2IF_1} \quad (4)$$

as indicated by the numeral 216 shown in FIG. 3.

In equations (2), (3), and (4), $N_1$, $N_2$, and $N_3$ are in watts. If the first two of these output noise power measurements are added together and the third one is subtracted:

$$N_1 + N_2 - N_3 = 2(FGN_i)_{RF} \tag{5}$$

This eliminates the power from the unwanted sidebands and leaves only the noise power at the desired RF measurement frequency. Therefore:

$$\text{Single Sideband Noise Figure} = \frac{N_1 + N_2 - N_3}{2GN_i} \tag{6}$$

Figure 4:
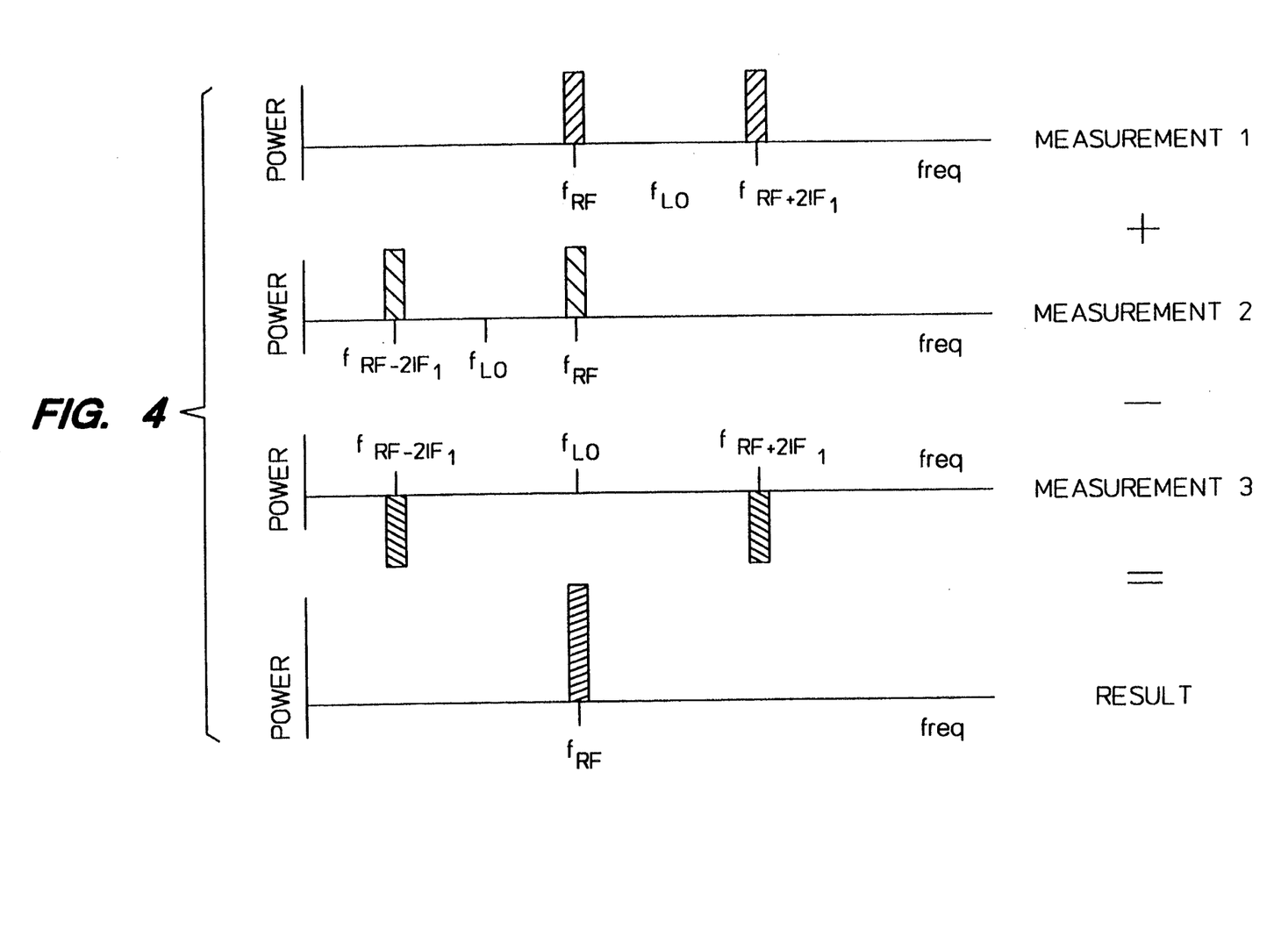
FIG. 4 graphically illustrates cancellation of unwanted sidebands when three double sideband measurements performed in accordance with the method of the invention are combined to provide a single sideband noise figure measurement.

FIG. 4 shows graphically how the third measurement cancels out the unwanted sidebands from the previous two measurements.

Now, the effect of change in noise source output impedance between its "hot" and "cold" states on measurement accuracy has previously been examined. See, G. Mamola and M. Sannino, "Source Mismatch Effects on Measurements of Linear Two-Port Noise Temperatures," *IEEE Trans. Instrum. Meas.*, vol. IM-24, no. 3, pp. 239–242, September 1975, and N. J. Kuhn, "Curing a Subtle but Significant Cause of Noise Figure Error," *Microwave Journal*, pp. 85–98, June 1984. The effect of noise source impedance mismatch on receiver noise figure and gain has also been presented. See, L. Pradell, A. Comeron, and A. Ramirez, "A General Analysis of Errors in Noise Measurement Systems," 18th *European Microwave Conference*, pp. 924–929, 1988, M. W. Pospieszalski, "On the Measurement of Isolator and Receiver with Isolator at the Input," *IEEE Trans. Microwave Theory Tech.*, vol. MTT-34, no. 4, pp. 451–453, April 1986, and U. Meier, "Measurements of Non-Matched Twoports with Automatic Noise Figure Meters," *Arch. Elektron. Ubertragungstechn.*, vol. 43, no. 2, pp. 125–128, 1989.

Figure 2B:
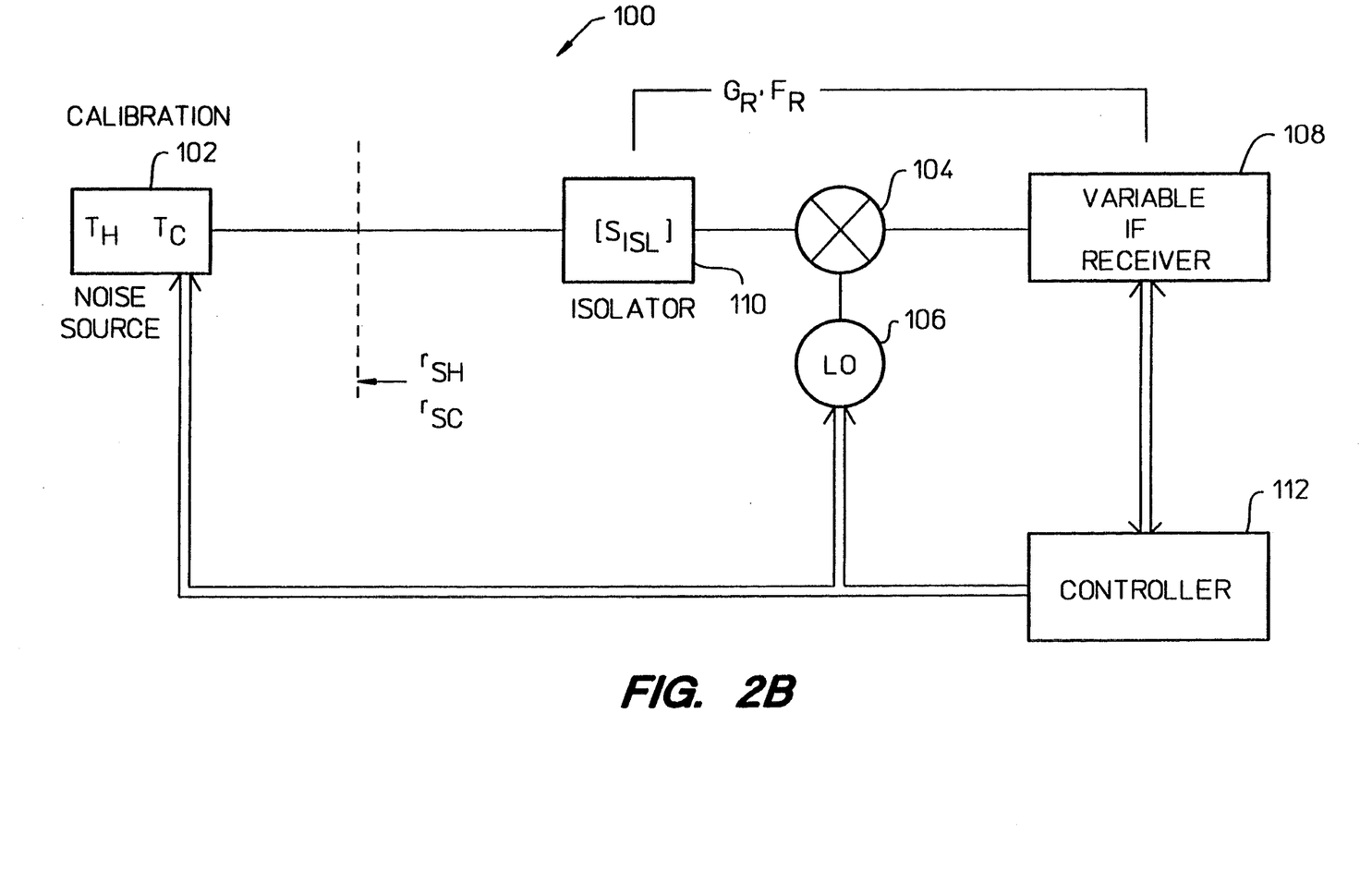

In accordance with a preferred embodiment of the method of the invention, output noise power measurements are corrected for both change in output impedance of the noise source 102 and noise source impedance mismatch with the receiver 108. Initially, the S-parameters of the DUT and the isolator 110 and the noise source output reflection coefficient in the "hot" and "cold" states are characterized in a conventional manner over the frequency range of interest using a vector network analyzer, as indicated by the numeral 298 shown in FIG. 5. The cold state of the noise source 102 is with the noise diode incorporated into the noise source "off" so that the noise source appears as a resistor at room temperature, whose value is equal to the characteristic impedance of the remainder of the noise measurement system 100, for example, 50Ω. The hot state of the noise source 102 is with the noise diode "on" so that the noise source appears as a resistor at an elevated temperature. Both hot and cold output noise power measurements are performed with the noise source 102 connected to the input of the isolator 110 in order to calibrate the receiver 108, as shown in FIG. 2B. Cold noise power measurements are then performed with the DUT inserted between the noise source 102 and the isolator 110, as shown in FIG. 2A.

Figure 5:
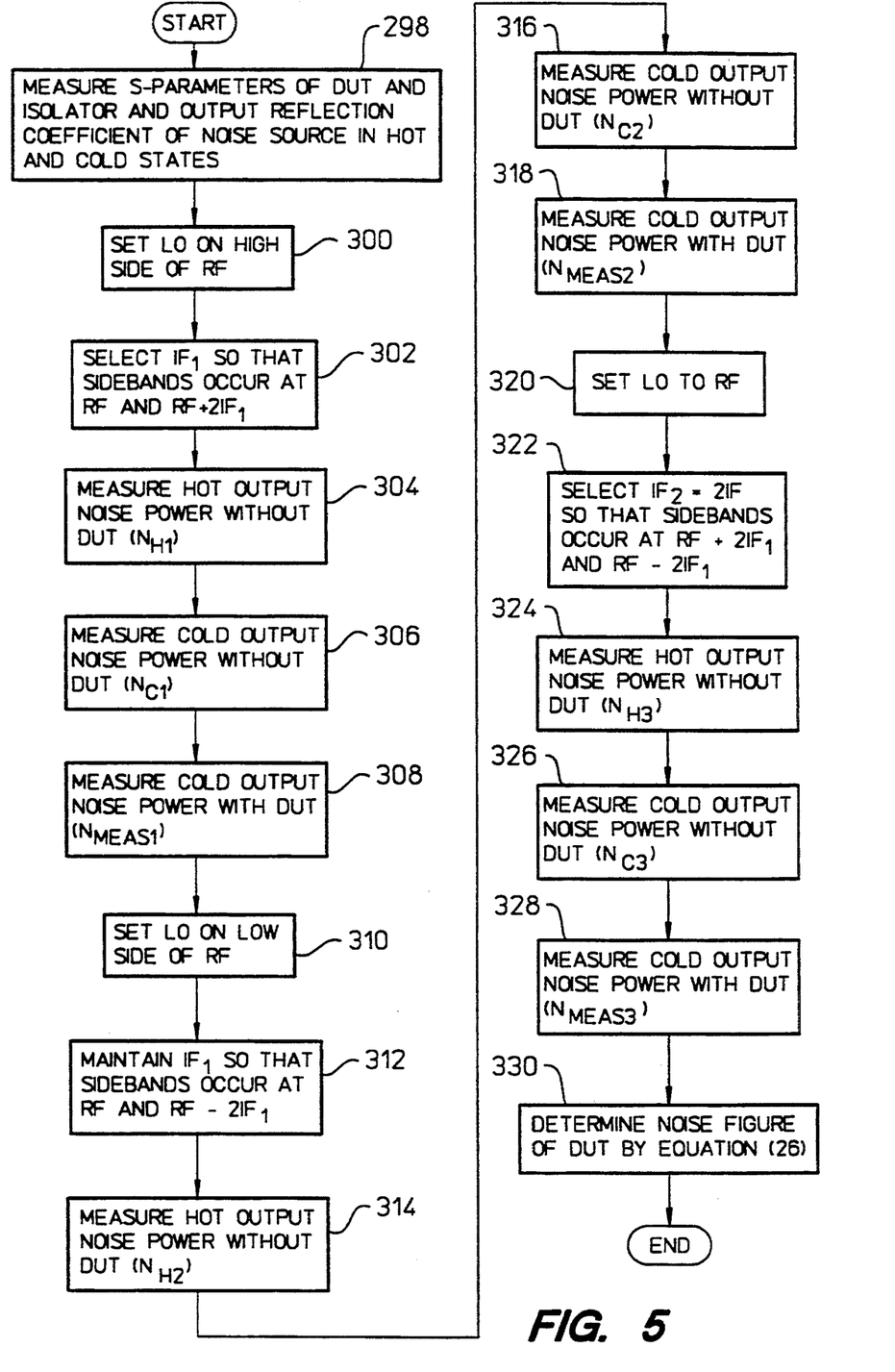
FIG. 5 is a flow chart in accordance with another embodiment of the method of the invention for determining a single sideband noise figure from three double sideband measurements on a device under test, in which the single sideband noise figure measurement includes full noise source impedance mismatch correction.

In accordance with the preferred embodiment of the method of the invention, three hot and three cold output noise power measurements during the calibration mode and three output noise power measurements with the DUT inserted between the noise source 102 and the isolator 110 during the measurement mode are performed at each frequency to obtain the single sideband noise figure for the DUT. In each case, a first measurement is performed with the local oscillator 106 set by the controller 112 on the high side of the desired RF, as indicated by the numeral 300 shown in FIG. 5. The intermediate frequency ($IF_1$) is selected by the controller 112 such that the two measured sidebands occur at the desired RF and at $RF + 2IF_1$, as indicated by the numeral 302 shown in FIG. 5. This results in hot calibration ($N_{H1}$), cold calibration ($N_{C1}$), and first measurement ($N_{MEAS1}$) output noise power measurements of:

$$N_{H1} = [(kBT_H + kBT_R)G_R(0)M_H]_{RF} + [(kBT_H + kB\text{-} T_R)G_R(0)M_H]_{RF+2IF_1} \tag{7}$$

as indicated by the numeral 304 shown in FIG. 5, $$N_{C1} = [(kBT_C + kBT_R)G_R(0)M_C]_{RF} + [(kBT_C + kB\text{-} T_R)G_R(0)M_C]_{RF+2IF_1} \tag{8}$$

as indicated by the numeral 306 shown in FIG. 5, and $$N_{MEAS1} = [[(kBT_C + kBT_E)G_{DUT} + kBT_R]G_R(0)M_{DUT}]_{RF} + [[(kBT_C + kBT_E)G_{DUT} + kBT_R]G_R(0)M_{DUT}]_{RF+2IF_1} \tag{9}$$

as indicated by the numeral 308 shown in FIG. 5.

$T_H$ and $T_C$ are the temperatures of the noise source 102 in its hot and cold states selected by the controller 112 ($T_H$ being calculated from the excess noise ratio of the noise source), and $T_R$ and $T_E$ are the effective input noise temperatures of the receiver 108 and the DUT, respectively. B represents the measurement bandwidth, and k is Boltzmann's constant.

$G_R(0)$ is the available gain of the receiver 108 when a reflection coefficient of zero is connected to the input of the receiver 108. When this reflection coefficient is not zero, the available gain of the receiver 108 is related to $G_R(0)$ by mismatch factors. See, U. Meier, "Measurements of Non-Matched Twoports with Automatic Noise Figure Meters," *Arch. Elektron. Ubertragungstechn.*, vol. 43, no. 2, pp. 125–128, 1989, and U. Meier, J. H. Hinken, and. M. Ikonomou, "Rauschparameter von GaAs-MESFETs in Flossenleitungstechnik," *Kleinheubacher Berichte*, vol. 32, pp. 137–145, 1989. The mismatch factors are:

$$M_H = \frac{1 - |\Gamma_{SH}|^2}{|1 - S_{11ISL}\Gamma_{SH}|^2} \tag{10}$$

$$M_C = \frac{1 - |\Gamma_{SC}|^2}{|1 - S_{11ISL}\Gamma_{SC}|^2}$$

$$M_{DUT} = \frac{1 - |\Gamma_{OUT}|^2}{|1 - S_{11ISL}\Gamma_{OUT}|^2}$$

where $\Gamma_{OUT}$ is the test device output reflection coefficient when connected to the noise source 102, $\Gamma_{SH}$ and $\Gamma_{SC}$ are the noise source output reflection coefficients in its hot and cold states, respectively, and $S_{11ISL}$ represents $S_{11}$ of the isolator 110.

$G_{DUT}$ is the available gain of the DUT at a particular frequency and is calculated from its S-parameters and the noise source output reflection coefficient using the well-known relationship:

$$G_{DUT} = \frac{|S_{21}|^2(1 - |\Gamma_{SC}|^2)}{|1 - S_{11}\Gamma_{SC}|^2 - |(S_{12}S_{21} - S_{11}S_{22})\Gamma_{SC} + S_{22}|^2} \quad (11)$$

For the second measurement, the local oscillator 106 is set on the low side of the desired RF, as indicated by the numeral 310 shown in FIG. 5. The intermediate frequency remains the same such that the measured sidebands occur at the desired RF and at RF−2IF$_1$, as indicated by the numeral 312 shown in FIG. 5. This results in hot calibration (N$_{H2}$), cold calibration (N$_{C2}$), and second measurement (N$_{MEAS2}$) output noise power measurements of:

$$N_{H2} = [(kBT_H + kBT_R)G_R(0)M_H]_{RF} + [(kBT_H + kB T_R)G_R(0)M_H]_{RF-2IF_1} \quad (12)$$

as indicated by the numeral 314 shown in FIG. 5, $$N_{C2} = [(kBT_C + kBT_R)G_R(0)M_C]_{RF} + [(kBT_C + kB T_R)G_R(0)M_C]_{RF-2IF_1} \quad (13)$$

as indicated by the numeral 316 shown in FIG. 5, and $$N_{MEAS2} = [[(kBT_C + kBT_E)G_{DUT} + kBT_R]G_R(0)M_{DUT}]_{RF} + [[(kBT_C + kBT_E)G_{DUT} + kBT_R]G_R(0)M_{DUT}]_{RF-2IF_1} \quad (14)$$

as indicated by the numeral 318 shown in FIG. 5.

The third measurement is performed with the local oscillator 106 set to the desired RF, as indicated by the numeral 320 shown in FIG. 5. The intermediate frequency is selected as twice its former frequency (IF$_2$=−2×IF$_1$) such that the two sidebands occur at RF+2IF$_1$ and RF−2IF$_1$, as indicated by the numeral 322 shown in FIG. 5. This results in hot calibration (N$_{H3}$), cold calibration (N$_{C3}$), and third measurement (N$_{MEAS3}$) output noise power measurements of:

$$N_{H3} = [(kBT_H + kBT_R)G_R(0)M_H]_{RF+2IF_1} + [(kBT_H + kBT_R)G_R(0)M_H]_{RF-2IF_1} \quad (15)$$

as indicated by the numeral 324 shown in FIG. 5, $$N_{C3} = [(kBT_C + kBT_R)G_R(0)M_C]_{RF+2IF_1} + [(kBT_C + kBT_R)G_R(0)M_C]_{RF-2IF_1} \quad (16)$$

as indicated by the numeral 326 shown in FIG. 5, and $$N_{MEAS3} = [[(kBT_C + kBT_E)G_{DUT} + kBT_R]G_R(0)M_{DUT}]_{RF+2IF_1} \quad (17)$$

as indicated by the numeral 328 shown in FIG. 5. All noise powers are in watts. If the first two of these output noise power measurements are added together and the third one is subtracted:

$$N_H = N_{H1} + N_{H2} - N_{H3} = 2[(kBT_H + kBT_R)G_R(0)M_H]_{RF} \quad (18)$$

$$N_C = N_{C1} + N_{C2} - N_{C3} = 2[(kBT_C + kBT_R)G_R(0)M_C]_{RF} \quad (19)$$

$$N_{MEAS} = N_{MEAS1} + N_{MEAS2} - N_{MEAS3} = 2[[(kBT_C + kBT_E)G_{DUT} + kBT_R]G_R(0)M_{DUT}]_{RF} \quad (20)$$

By this method the power from the unwanted sidebands is eliminated leaving only the noise power at the required RF frequency. FIG. 4 illustrates this in graphical form.

Furthermore, the noise temperature T$_R$ of the receiver 108 is related to the receiver noise factor when connected to a device under test with zero output reflection coefficient by the same mismatch factors as G$_R$(0):

$$T_R = T_0\left(\frac{F_R(0)}{M} - 1\right) \quad (21)$$

See, U. Meier, "Measurements of Non-Matched Two-ports with Automatic Noise Figure Meters," *Arch. Elektron. Ubertragungstechn.*, vol. 43, no. 2, pp. 125–128, 1989, and U. Meier, J. H. Hinken, and M. Ikonomou, "Rauschparameter von GaAs-MESFETs in Flossenleitungstechnik," *Kleinheubacher Berichte*, vol. 32, pp. 137–145, 1989.

Combining this with equations (18), (19), and (20) gives:

$$N_H = 2kBG_R(0)[T_0F_R(0) + M_H(T_H - T_0)] \quad (22)$$

$$N_C = 2kBG_R(0)[T_0F_R(0) + M_C(T_C - T_0)] \quad (23)$$

$$N_{MEAS} = 2kBG_R(0)[T_0F_R(0) + M_{DUT}(T_0F_{DUT}G_{DUT} + T_CG_{DUT} - T_0G_{DUT} - T_0)] \quad (24)$$

Subtracting equation (23) from equation (22) and rearranging yields:

$$2kBG_R(0) = \frac{N_H - N_C}{M_H(T_H - T_0) + M_C(T_0 - T_C)} \quad (25)$$

If T$_C$ is assumed equal to T$_0$ for simplicity, equations (23), (24), and (25) provide:

$$F_{DUT} = \frac{1}{G_{DUT}}\left[\frac{(N_{MEAS} - N_C)M_H(T_H - T_0)}{(N_H - N_C)T_0M_{DUT}} + 1\right] \quad (26)$$

as indicated by the numeral 330 shown in FIG. 5. The test device noise figure is simply its noise factor expressed in dB.

A number of assumptions are implicit in the above derivations. The assumptions are as follows.

The first assumption is that the shape of the passband of the receiver 108 does not change between the two intermediate frequencies (IF$_1$ and IF$_2$). The HP 8970A noise figure meter used as the receiver 108 has a bandwidth of approximately 4 MHz. FIG. 4 illustrates the measured noise powers to have ideal identical bandwidths. The shape of the passband need not be ideal, but an error will occur if the shape of the passband changes between the two intermediate frequencies, as this would adversely affect the cancellation of the unwanted sidebands.

The second assumption is that the mixer 104 down-converts both sidebands in the same proportion at each IF. The power down-converted by a mixer is typically assumed to be an average of the power in the two sidebands. Although it is not necessary for each sideband to be down-converted by the same proportion, an error will result if the imbalance changes with the different intermediate frequencies.

It is likely that the first two assumptions are valid, provided that the intermediate frequency of the receiver 108 is high compared to the receiver bandwidth. For instance, a 4 MHz bandwidth is a significant proportion of a 10 MHz IF, so the change in passband shape is likely to be more significant when using intermediate frequencies of 10 MHz and 20 MHz than when using 100 MHz and 200 MHz.

The third assumption is that the receiver 108 tunes exactly to the RF measurement frequency. The HP 8970A noise figure meter used as the receiver 108 has a maximum tuning error of ±6 MHz. See, *HP 8970A Operating and Service Manual*, HP Part No. 08970-90015, Hewlett-Packard Co., Palo Alto, Calif. A receiver tuning error could again adversely affect the cancellation of the unwanted sidebands. Also, if the receiver 108 does not tune to exactly the same frequency as the vector network analyzer used to measure S-parameters, errors will occur in correcting for impedance mismatch. For modern measurement receivers with synthesized local oscillators, this assumption is valid. Errors produced by tuning inaccuracies in the measurement of very badly mismatched devices have been investigated in E. C. Valk, D. Routledge, J. F. Vaneldik, and T. L. Landecker, "Microwave Noise Measurement Errors Caused by Frequency Discrepancies and Nonzero Bandwidth," *IEEE Trans. Microwave Theory Tech.*, vol. MTT-42, no. 6, pp. 983-989, December 1993, but are probably negligible here.

Furthermore, it is assumed that the ambient measurement temperature is stable at 290K. A temperature other than 290K is readily accounted for in the derivations, but if the temperature were to change between the output noise power measurements performed at different intermediate frequencies, an error will result. The effect of this is assumed to be negligible. See, M. W. Pospieszalski, "Comments on 'Simultaneous Determination of Transistor Noise, Gain and Scattering Parameters for Amplifier Design Through Noise Figure Measurements Only' and reply by G. Martines and M. Sannino," *IEEE Trans. Insmira. Meas.*, vol. IM-35, no. 2, pp. 228, June 1986, and M. W. Pospieszalski, "Comments on 'A Method for Measurement of Losses in the Noise-Matching Microwave Network While Measuring Transistor Noise Parameters' and reply by G. Martines and M. Sannino," *IEEE Trans. Microwave Theory Tech.*, vol. MTT-36, no. 1, pp. 170-172, January 1988.

The last assumption is that the isolator 110 is ideal. The error produced by the use of a real isolator is assumed negligible over the frequency range of interest.

The method for determining single sideband noise figure from double sideband measurements in accordance with the invention has been tested on both active and passive devices at frequencies ranging from 3 GHz to 4 GHz and with $IF_1=200$ MHz and $IF_2=400$ MHz. The gain of each DUT as a function of frequency was measured using an HP 8510C vector network analyzer available from Hewlett-Packard Company, Palo Alto, Calif., and output noise powers were measured with the HP 8970A noise figure meter. A 6 dB attenuator and a packaged MMIC amplifier have been used as test devices. In order to demonstrate that the method in accordance with the invention is accurate, test devices with a noise figure that varies strongly with frequency were measured. To achieve this, lengths of waveguide (WR-187) were connected to the inputs of the attenuator and the amplifier, and the noise figures of the resulting cascades were measured at approximately the waveguide cut-off frequency where the attenuation changes sharply.

Figure 6:
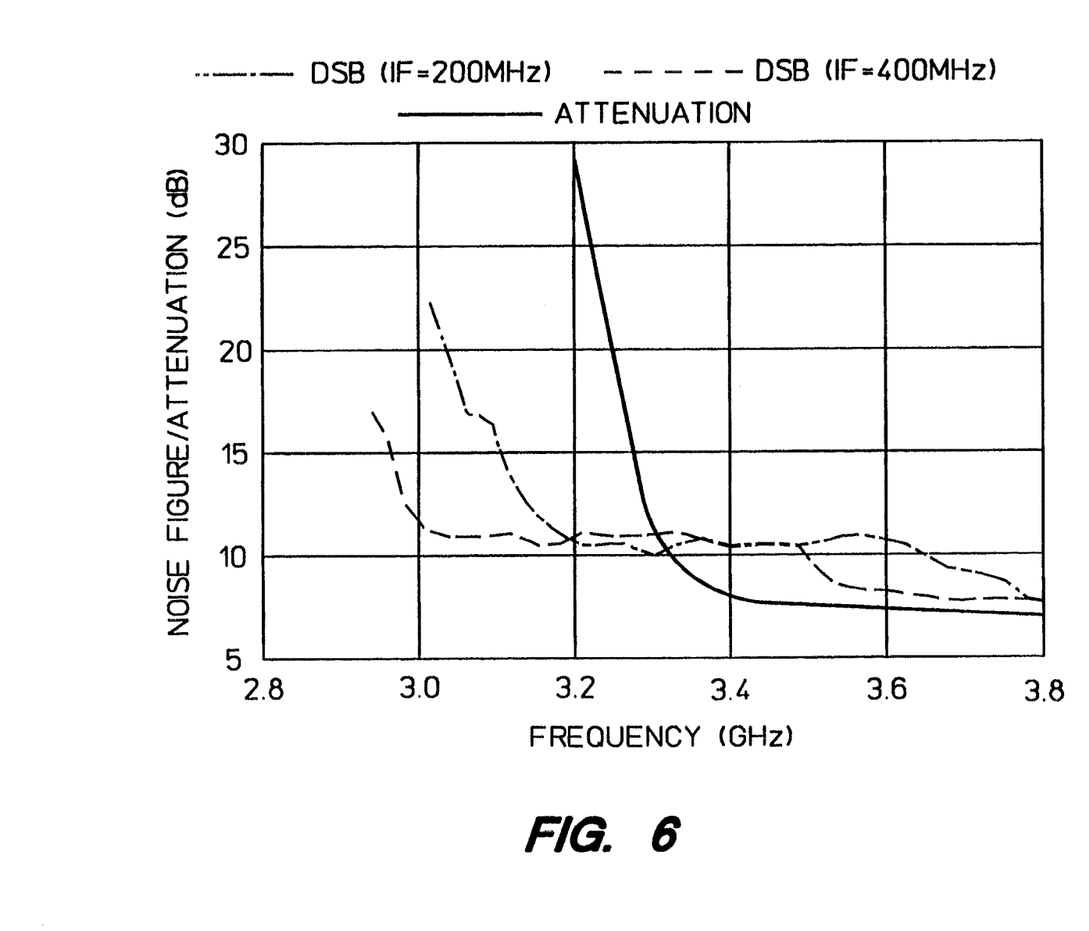
FIG. 6 illustrates variation of waveguide/attenuator cascade double sideband (DSB) noise figure with frequency for different intermediate frequencies.

FIG. 6 illustrates the double sideband noise figure and available attenuation of the waveguide/attenuator cascade to demonstrate how a DSB noise figure measurement deviates from the expected value at a particular frequency for test devices that do not have a flat frequency response and that, as expected, the result depends on the IF. The noise figure should be equal to the available attenuation for a passive device.

Figure 7:
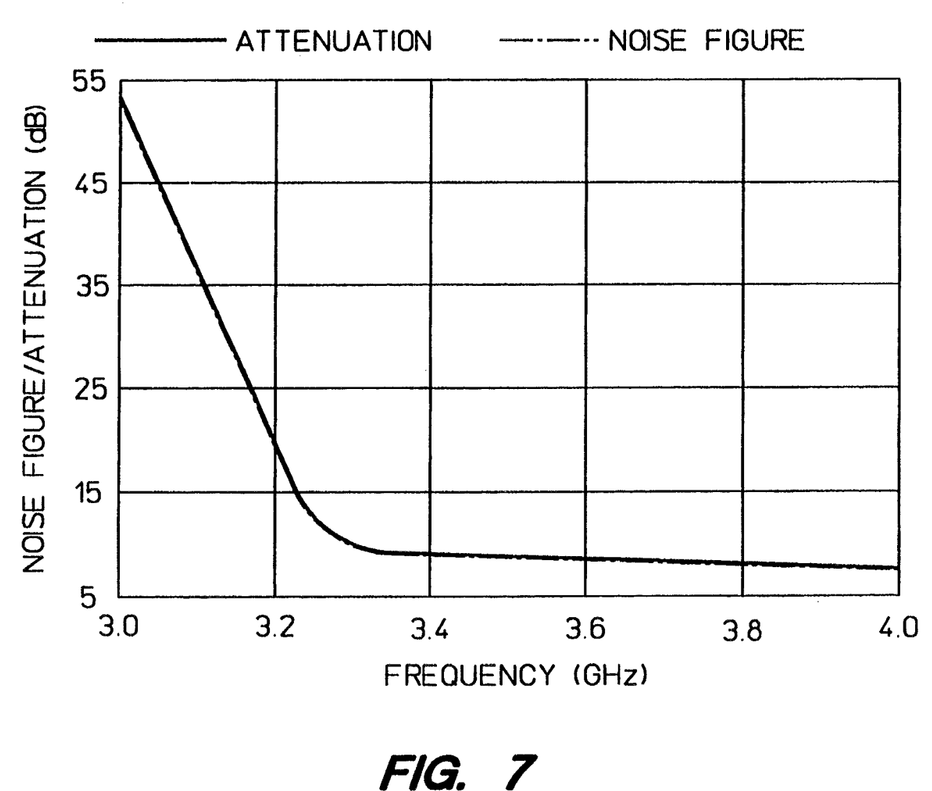
FIG. 7 illustrates waveguide/attenuator cascade noise figure determined by the method in accordance with the invention and available attenuation from 3 GHz to 4 GHz.

The noise figure calculated using equation (26) for the waveguide/attenuator cascade and the available attenuation of the test device are illustrated in FIG. 7. It can be seen that the method for determining single sideband noise figure from double sideband measurements in accordance with the method of the invention produces noise figures which lie almost on top of the available attenuation values, unlike the equivalent double sideband measurements shown in FIG. 6.

Figure 8:
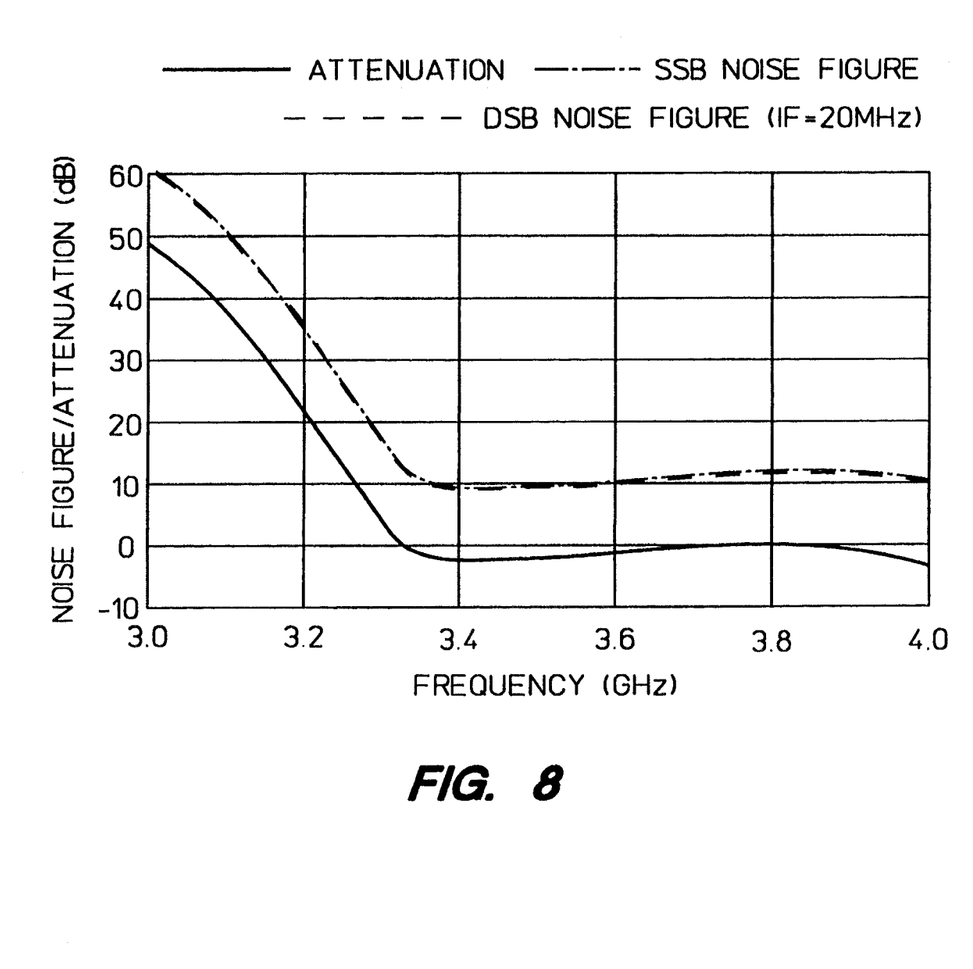
FIG. 8 illustrates waveguide/amplifier cascade noise figure determined by the method in accordance with the invention, DSB noise figure with small intermediate frequency, and available attenuation from 3 GHz to 4 GHz.

The noise figure calculated using equation (26) for the waveguide/amplifier cascade is illustrated in FIG. 8. The equivalent noise figures calculated with a DSB noise power measurement with small IF and the available attenuation are also shown for comparison. The noise figure at frequencies below the waveguide cut-off frequency is high due to the loss added by the waveguide. The test device noise figure should follow the same shape as the attenuation, although the noise figure has a higher value due to the noise added by the amplifier.

Figure 9:
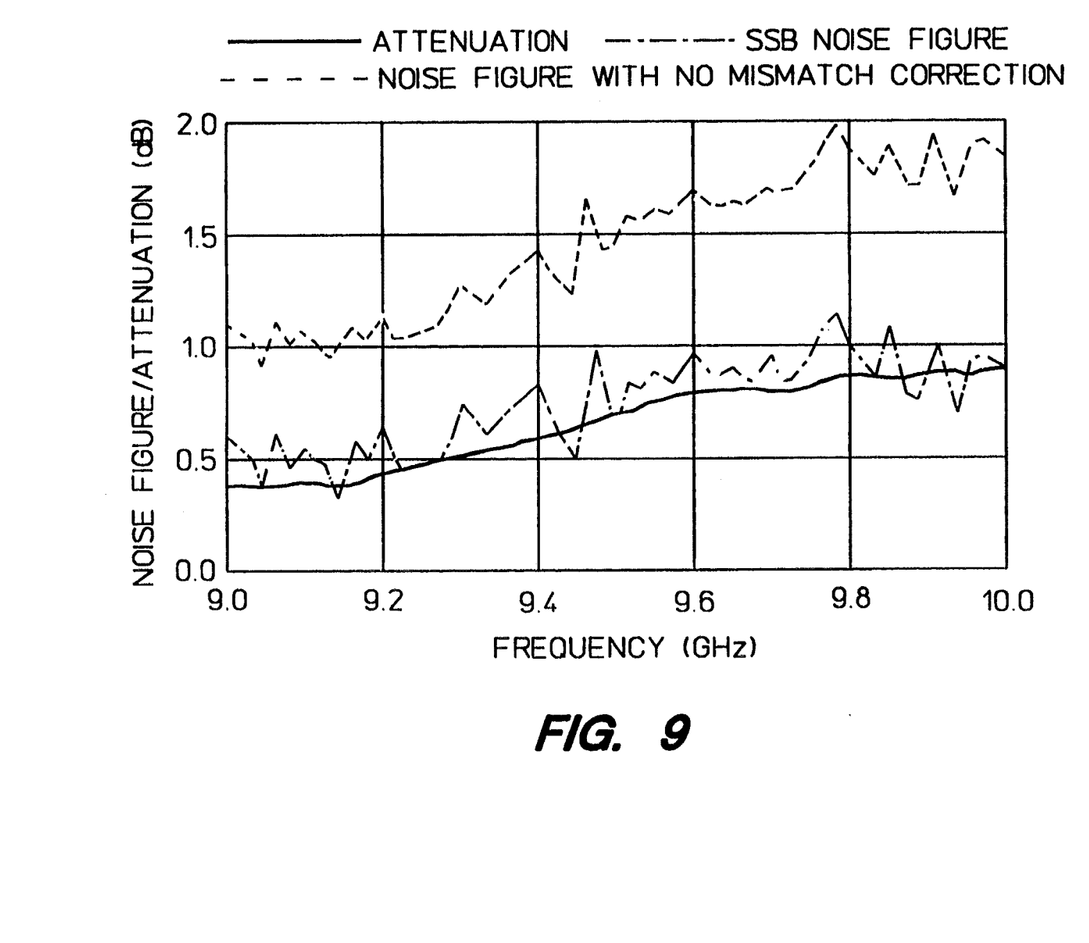
FIG. 9 illustrates attenuation and noise figures determined by the method in accordance with the invention with and without mismatch correction of a poorly matched passive test device.

Finally, as a test of the impedance mismatch correction procedure, FIG. 9 illustrates the available gain and noise figure of a passive mechanical tuner adjusted to provide a poor input and output match. The measured noise figure that is shown was determined from equation (26) and calculated assuming a perfectly matched test device (i.e., all mismatch factors equal to 1 and $G_{DUT}$ equal to $|S_{21}|^2$). It can be seen that the results which assume a perfectly matched test device have a significant error, while the mismatch-corrected results provide a noise figure close to the expected value (within the error caused by jitter).

In summary, it is well-known that a double sideband noise figure measurement is prone to error if the test device does not have a flat frequency response. From FIG. 6, it can be seen that the DSB noise figure measurement on a 6 dB waveguide/attenuator cascade differs from the expected value at approximately the waveguide cut-off frequency where its noise figure is frequency dependent and agrees with it at higher frequencies where the response is flatter as expected. The method for determining single sideband noise figure from double sideband measurements in accordance with the invention has been successfully applied to both calibration and measurement to cancel out the unwanted sidebands and achieve single sideband noise figures over the entire measurement frequency range without the need for expensive filters. Full impedance mismatch correction can be included in the method, and FIG. 9 shows that this has improved the accuracy of the measurements for mismatched test devices.

The method for determining single sideband noise figure from double sideband measurements in accordance with the invention requires the use of three noise power measurements per frequency point. Although this appears more time-consuming that conventional techniques, for measurements over a range of frequencies, if the IF and frequency step are carefully selected, only just over twice the conventional number of measurements need to be performed. The additional measurements are mostly performed at the same frequencies as those required by conventional techniques with only two added frequency points needed in the frequency span. A number of assumptions are implicit in this method, but it is thought that provided that the intermediate frequency is high compared to the receiver bandwidth, the errors due to those assumptions will be negligible.

It will be understood and appreciated that the embodiments of the present invention described above are susceptible to various modifications, changes, and adaptations. For example, although an external controller 112 is shown in FIGS. 2A and 2B, the controller can alternatively be an internal controller, such as a microprocessor, incorporated into the receiver 108. Furthermore, the noise diode incorporated into the noise source 102 can alternatively be a resistor that is heated by an oven and cooled by liquid nitrogen to provide the hot and cold states, respectively, of the noise source. The noise source 102 can also be a gas discharge tube that is on and off or an antenna that is alternately oriented at the ground (or a radio star) and empty sky to provide the hot and cold states, respectively. All are intended to be comprehended within the meaning and range of equivalents of the appended claims.

What is claimed is:

1. Apparatus for determining the single sideband noise figure for a device under test at a given RF measurement frequency, comprising:
   a noise source having an output;
   a mixer having a first input, a second input, and an output;
   a device under test having an input connected to the output of the noise source and an output connected to the first input of the mixer;
   a local oscillator for generating a variable frequency local oscillator signal, the local oscillator having an output connected to the second input of the mixer;
   a tunable intermediate frequency receiver having an input connected to the output of the mixer for measuring the output noise power of the device under test; and
   a controller connected to the local oscillator and the receiver;
   the local oscillator being controlled by the controller to separately produce three local oscillator signals comprising a first local oscillator signal having a frequency on the high side of the given RF measurement frequency, a second local oscillator signal having a frequency on the low side of the given RF measurement frequency, and a third local oscillator signal having a frequency at the given RF measurement frequency;
   the receiver being controlled by the controller to measure a first output noise power of the device under test at a first predetermined intermediate frequency when the local oscillator produces the first local oscillator signal, a second output noise power of the device under test at the first predetermined intermediate frequency when the local oscillator produces the second local oscillator signal, and a third output noise power of the device under test at a second predetermined intermediate frequency equal to twice the first intermediate frequency when the local oscillator produces the third local oscillator signal; and
   the controller for combining the first, second, and third output noise power measurements for cancelling image noise power to provide a single sideband noise figure measurement for the device under test.

2. The apparatus of claim 1 wherein the tunable intermediate frequency receiver is a noise figure meter.

3. The apparatus of claim 1 wherein the controller combines the first, second, and third output noise power measurements for cancelling image noise power to provide a single sideband noise figure measurement for the device under test by adding the first output noise power measurement and the second output noise power measurement and subtracting the third output noise power measurement to provide an uncorrected single sideband noise figure measurement for the device under test.

4. The apparatus of claim 1, further comprising an isolator having an input connected to the output of the device under test and an output connected to the first input of the mixer to facilitate a correction to account for change in receiver noise figure and gain with noise source impedance mismatch.

5. The apparatus of claim 1 wherein the controller is an external controller.

6. The apparatus of claim 1 wherein the controller is an internal controller incorporated into the tunable intermediate frequency receiver.

7. A method for determining the single sideband noise figure for a device under test at a given RF measurement frequency (RF), comprising the steps of:
   connecting an input of a device under test to an output of a noise source;
   connecting an output of the device under test to a first input of a mixer;
   connecting a local oscillator to a second input of the mixer;
   connecting an output of the mixer to a tunable intermediate frequency receiver;
   producing a first local oscillator signal having a frequency on the high side of the given RF measurement frequency;
   selecting a first receiver intermediate frequency ($IF_1$) such that two measured sidebands occur at the given RF measurement frequency and at $RF+2IF_1$;
   measuring with the receiver a first output noise power of:

$$N_1 = (FGN_i)_{RF} + (FGN_i)_{RF+2IF_1}$$

while the first local oscillator signal is produced and the first receiver intermediate frequency is selected;
   producing a second local oscillator signal having a frequency on the low side of the given RF measurement frequency;
   selecting the first receiver intermediate frequency ($IF_1$) such that two measured sidebands occur at the given RF measurement frequency and at $RF-2IF_1$;
   measuring with the receiver a second output noise power of:

$$N_2 = (FGN_i)_{RF} + (FGN_i)_{RF-2IF_1}$$

while the second local oscillator signal is produced and the first receiver intermediate frequency is selected;
   producing a third local oscillator signal having a frequency equal to the given RF measurement frequency;
   selecting a second receiver intermediate frequency ($IF_2$) as twice the first intermediate frequency ($IF_2 = 2 \times IF_1$) such that two measured sidebands occur at $RF + 2IF_1$ and $RF - 2IF_1$;

measuring with the receiver a third output noise power of:

$$N_3 = (FGN_i)_{RF+2IF_1} + (FGN_i)_{RF-2IF_1}$$

while the third local oscillator signal is produced and the second receiver intermediate frequency is selected;

combining the first, second, and third noise power measurements by adding the first and second and subtracting the third:

$$N_1 + N_2 - N_3 = 2(FGN_i)_{RF}$$

to eliminate the power from unwanted sidebands and leave only the noise power at the given RF measurement frequency; and determining the single sideband noise figure for the device under test as:

$$\text{Single Sideband Noise Figure} = \frac{N_1 + N_2 - N_3}{2GN_i}$$

where $N_i$ represents noise power input and G represents the gain of the device under test.

8. The method of claim 7, further comprising the steps of:

disconnecting the input of the device under test from the output of the noise source and the output of the device under test from the first input of the mixer;

connecting an input of an isolator to the output of the noise source and an output of the isolator to the first input of the mixer;

measuring S-parameters of the device under test with a vector network analyzer to provide available gain data;

measuring S-parameters of the isolator with the vector network analyzer to provide first calibration data;

measuring an output reflection coefficient of the noise source in hot and cold states with the vector network analyzer to provide second calibration data; and correcting the output noise power measurements for both change in output impedance of the noise source and noise source impedance mismatch with the receiver using the available gain data and first and second calibration data.

9. The method of claim 8 wherein the cold state of the noise source is with a noise diode incorporated into the noise source "off" so that the noise source appears as a resistor at room temperature, whose value is equal to a characteristic impedance, and the hot state of the noise source is with the noise diode "on" so that the noise source appears as a resistor at an elevated temperature.

10. The method of claim 9 wherein the characteristic impedance is 50Ω.

11. A method for determining the single sideband noise figure for a device under test at a given RF measurement frequency (RF), comprising the steps of:

measuring S-parameters of a device under test with a vector network analyzer;

measuring S-parameters of the isolator with the vector network analyzer;

measuring an output reflection coefficient of the noise source in hot and cold states with the vector network analyzer;

connecting an input of an isolator to an output of a noise source and an output of the isolator to a first input of a mixer;

connecting a local oscillator to a second input of the mixer;

connecting an output of the mixer to a tunable intermediate frequency receiver;

producing a first local oscillator signal having a frequency on the high side of the given RF measurement frequency;

selecting a first receiver intermediate frequency ($IF_1$) such that two measured sidebands occur at the given RF measurement frequency and at $RF + 2IF_1$;

performing with the receiver a first hot calibration measurement ($N_{H1}$):

$$N_{H1} = [(kBT_H + kBT_R)G_R(0)M_H]_{RF} + [(kBT_H + kB T_R)G_R(0)M_H]_{RF+2IF_1}$$

performing with the receiver a first cold calibration measurement ($N_{C1}$):

$$N_{C1} = [(kBT_C + kBT_R)G_R(0)M_C]_{RF} + [(kBT_C + kB T_R)G_R(0)M_C]_{RF+2IF_1}$$

connecting an input of the device under test to the output of the noise source and an output of the device under test to the input of the isolator;

performing with the receiver a first output noise power measurement ($N_{MEAS1}$):

$$N_{MEAS1} = [[(kBT_C + kBT_E)G_{DUT} + kBT_R]G_R(0)M_{DUT}]_{RF} + [[(kBT_C + kBT_E)G_{DUT} + kBT_R]G_R(0)M_{DUT}]_{RF+2IF_1}$$

disconnecting the input of the device under test from the output of the noise source and the output of the device under test from the first input of the mixer;

connecting the output of the noise source to the input of the isolator;

producing a second local oscillator signal having a frequency on the low side of the given RF measurement frequency;

selecting the first receiver intermediate frequency ($IF_1$) such that two measured sidebands occur at the given RF measurement frequency and at $RF - 2IF_1$;

performing with the receiver a second hot calibration measurement $N_{H2}$):

$$N_{H2} = [(kBT_H + kBT_R)G_R(0)M_H]_{RF} + [(kBT_H + kB T_R)G_R(0)M_H]_{RF-2IF_1}$$

performing with the receiver a second cold calibration measurement ($N_{C2}$):

$$N_{MEAS2} = [[(kBT_C + kBT_E)G_{DUT} + kBt_R]G_R(0)M_{DUT}]_{RF} + [[(kBT_C + kBT_E)G_{DUT} + kBT_R]G_R(0)M_{DUT}]_{RF-2IF_1}$$

connecting the input of the device under test to the output of the noise source and the output of the device under test to the input of the isolator;

performing with the receiver a second output noise power measurement ($N_{MEAS2}$):

$$N_{MEAS2}=[[(kBT_C+kBT_E)G_{DUT}+kBt_R]G_R(0)M_{DUT}]_{RF}+[[(kBT_C+kBT_E)G_{DUT}+kBT_R]G_R(0)M_{DUT}]_{RF-2IF_1}$$

disconnecting the input of the device under test from the output of the noise source and the output of the device under test from the first input of the mixer;

connecting the output of the noise source to the input of the isolator;

producing a third local oscillator signal having a frequency equal to the given RF measurement frequency;

selecting a second receiver intermediate frequency (IF$_2$) chosen as twice the first intermediate frequency (IF$_2$=2×IF$_1$) such that two measured sidebands occur at RF+2IF$_1$ and RF−2IF$_1$;

performing with the receiver a third hot calibration measurement (N$_{H3}$):

$$N_{H3}=[(kBT_H+kBT_R)G_R(0)M_H]_{RF+2IF_1}+[(kBT_H+kBT_R)G_R(0)M_H]_{RF-2IF_1}$$

performing with the receiver a third cold calibration measurement (N$_{C3}$):

$$N_{C3}=[(kBT_C+kBT_R)G_R(0)M_C]_{RF+2IF_1}+[(kBT_C+kBT_R)G_R(0)M_C]_{RF-2IF_1}$$

connecting the input of the device under test to the output of the noise source and the output of the device under test to the input of the isolator;

performing with the receiver a third output noise power measurement (N$_{MEAS3}$):

$$N_{MEAS3}=[[(kBT_C+kBT_E)G_{DUT}+kBT_R]G_R(0)M_{DUT}]_{RF+2IF_1}+[[(kBT_C+kBT_E)G_{DUT}+kBT_R]G_R(0)M_{DUT}]_{RF-2IF_1}$$

and determining the single sideband noise figure for the device under test as:

$$F_{DUT} = \frac{1}{G_{DUT}} \left[ \frac{(N_{MEAS} - N_C)M_H(T_H - T_0)}{(N_H - N_C)T_0 M_{DUT}} + 1 \right]$$

where $N_{MEAS}=N_{MEAS1}+N_{MEAS2}-N_{MEAS3}$, $N_H=N_{H1}+N_{H2}-N_{H3}$, $N_C=N_{C1}+N_{C2}-N_{C3}$, $G_R(0)$ is the available gain of the receiver when a reflection coefficient of zero is connected to the receiver input, $T_H$ and $T_C = T_0$ are the temperatures of the noise source in its hot and cold states, $T_R$ and $T_E$ are the effective input noise temperatures of the receiver and the device under test, respectively, $G_{DUT}$ is the available gain of the device under test at a particular frequency and is calculated from its S-parameters and the noise source output reflection coefficient using the relationship:

$$G_{DUT} = \frac{|S_{21}|^2(1 - |\Gamma_{SC}|^2)}{|1 - S_{11}\Gamma_{SC}|^2 - |(S_{12}S_{21} - S_{11}S_{22})\Gamma_{SC} + S_{22}|^2}$$

B represents the measurement bandwidth, and k is Boltzmann's constant.

12. The method of claim 10 wherein the cold state of the noise source is with a noise diode incorporated into the noise source "off" so that the noise source appears as a resistor at room temperature, whose value is equal to a characteristic impedance, and the hot state of the noise source is with the noise diode "on" so that the noise source appears as a resistor at an elevated temperature.

13. The method of claim 12 wherein the characteristic impedance is 50Ω.

14. The method of claim 10 wherein, when the reflection coefficient is not zero, the receiver available gain is related to $G_R(0)$ by mismatch factors:

$$M_H = \frac{1 - |\Gamma_{SH}|^2}{|1 - S_{11ISL}\Gamma_{SH}|^2}$$

$$M_C = \frac{1 - |\Gamma_{SC}|^2}{|1 - S_{11ISL}\Gamma_{SC}|^2}$$

$$M_{DUT} = \frac{1 - |\Gamma_{OUT}|^2}{1 - S_{11ISL}\Gamma_{OUT}|^2}$$

where $\Gamma_{OUT}$ is the output reflection coefficient of the device under test when connected to the noise source, $\Gamma_{SH}$ and $\Gamma_{SC}$ are output reflection coefficients of the noise source in its hot and cold states, respectively, and $S_{11ISL}$ represents $S_{11}$ of the isolator.

* * * * *